(12) United States Patent
Goldshlag

(10) Patent No.: US 6,766,411 B2
(45) Date of Patent: Jul. 20, 2004

(54) CIRCUIT FOR LOOPING SERIAL BIT STREAMS FROM PARALLEL MEMORY

(75) Inventor: Nathan L. Goldshlag, Arlington, MA (US)

(73) Assignee: Teradyne, Inc., Boston, MA (US)

( * ) Notice: Subject to any disclaimer, the term of this patent is extended or adjusted under 35 U.S.C. 154(b) by 240 days.

(21) Appl. No.: 10/170,122

(22) Filed: Jun. 12, 2002

(65) Prior Publication Data

US 2003/0233517 A1 Dec. 18, 2003

(51) Int. Cl.[7] .............................................. G06F 12/00
(52) U.S. Cl. ...................... 711/109; 711/110; 714/738; 370/366; 341/101
(58) Field of Search .................. 711/109–110; 370/100, 370/366; 714/718, 738; 341/95, 100–101

(56) References Cited

U.S. PATENT DOCUMENTS 4,445,215 A * 4/1984 Svendsen .................... 370/517
5,016,011 A * 5/1991 Hartley et al. ................ 341/95
5,726,651 A * 3/1998 Belot .......................... 341/101
6,169,500 B1 * 1/2001 Eriksson et al. ............. 341/100
6,480,981 B1 * 11/2002 Rhodes et al. ............... 714/738

* cited by examiner

Primary Examiner—Nasser Moazzami
(74) Attorney, Agent, or Firm—Bruce D. Rubenstein; Teradyne Legal Department

(57) ABSTRACT

A circuit for generating one or more serial bit streams includes a memory coupled to a reformatter, which is in turn coupled to a serializer for converting parallel data to serial data. The memory includes a plurality of words having a known bit width (e.g., 32 bits) for storing one or more serial bit streams. The length of each serial bit stream is generally not an integer multiple of the memory's bit width, causing the last word storing each serial bit stream to contain a gap. The reformatter eliminates each such gap by combining bits from the last word of a bit stream with bits from the first word to provide a completely filled word to the serializer. As operation proceeds, the reformatter continues to combine bits from successive words to ensure that completely filled words are produced. Gaps that formerly appeared when producing serial bit streams are thereby eliminated.

20 Claims, 6 Drawing Sheets

CIRCUIT FOR LOOPING SERIAL BIT STREAMS FROM PARALLEL MEMORY

CROSS-REFERENCES TO RELATED APPLICATIONS

Not Applicable.

STATEMENT REGARDING FEDERALLY SPONSORED RESEARCH OR DEVELOPMENT

Not Applicable.

REFERENCE TO MICROFICHE APPENDIX

Not Applicable

BACKGROUND OF THE INVENTION

1. Field of the Invention

This invention relates generally to automatic test equipment (ATE) for electronics, and, more particularly, to test equipment that includes circuitry for converting parallel data to serial bit streams for testing electronic devices.

2. Description of Related Art Including Information Disclosed Under 37 C.F.R. 1.97 and 1.98

Manufacturers of semiconductor devices commonly use testers, or automatic test equipment (ATE), to test whether devices meet their requirements. Devices that fail their tests can be discarded early in the manufacturing process, before additional costs are incurred. Devices with different levels of performance can be sorted into different categories, in response to test results, for sale at different prices.

As one of their many functions, testers generate stimulus signals for testing electronic devices. As shown in FIG. 1, data for generating stimulus signals are conventionally stored in a parallel memory 110. An address counter 112 addresses the memory 110 and increments upon each cycle of a memory clock (M-CLK). For applying parallel signals to a device under test (DUT), the memory 110 feeds data words to a bank of driver circuits (not shown). Each driver circuit buffers one bit of the memory and applies the buffered bit to a different node of the DUT. For generating serial data, the memory 110 feeds data to a serializer 114, which converts the parallel data to serial form. The serial data is then buffered by a driver circuit, which sends the buffered signal to a node of the DUT.

The serializer generally outputs serial data at a rate that equals the frequency of M-CLK times the word width of the memory 110. For example, if M-CLK runs at 100 MHz and the memory 110 stores data words that are 32-bits wide, the serializer outputs serial data at the rate of 32*100 MHz=3.2 GHz. The serializer's use of word width as a multiplier of output frequency ensures that the serializer outputs serial data continuously, without overlaps or gaps, to keep pace precisely with incoming data from the memory 110.

A need commonly arises in automatic testing to loop on a particular test pattern or group of test patterns. Each test pattern is generally encoded within a contiguous block of memory. To loop on a test pattern, the address counter 112 is set to a "base address," i.e., the memory address at which the pattern begins, and is caused to increment through the memory. As the address counter increments, the tester outputs test signals that correspond to the data stored in the memory. After reaching the last address in the memory of the test pattern, the address counter is reset to the base address and the test pattern is repeated. Because the tester restores the address counter to the base address on the very next cycle of M-CLK after it has assumed the last address, the loop proceeds continuously, without interruption.

A problem arises, however, when the test pattern prescribes a serial bit stream that contains a number of bits that is not an integer multiple of the memory word width. Consider the example shown in FIG. 2. A serial bit stream is encoded within four 32-bit memory words: W0–W3. The last word, W3, is only partially filled with data—it contains only 21 of a possible 32 bits. If the tester were to loop on this pattern, it would produce an 11-bit timing gap (32 bits–21 bits) corresponding to the time between the end of the current iteration of the pattern and the beginning of the next iteration.

This interruption in the output waveform can detrimentally affect testing. For example, many devices for which serial testing is sought tend to behave predictably when driven by known test patterns, but can deviate from their predicted behavior when the test pattern changes. Maintaining the test pattern without interruption is thus critical to ensuring predictable behavior of the device under test.

What is needed is a way of eliminating timing gaps that arise when looping serial bit streams, and therefore to avoid interrupting test patterns.

BRIEF SUMMARY OF THE INVENTION

With the foregoing background in mind, it is an object of the invention to produce serial bit streams without unwanted timing gaps.

To achieve the foregoing object, as well as other objectives and advantages, a circuit for generating one or more serial bit streams includes a memory coupled to a reformatter, which is in turn coupled to a serializer for converting parallel data to serial data. The memory includes a plurality of words having a known bit width (e.g., 32 bits) for storing one or more serial bit. The length of each serial bit stream may not be an integer multiple of the memory's bit width. Consequently, one of the words storing each serial bit stream may contain a gap. The reformatter eliminates each such gap by combining bits from the word containing the gap (generally the word encoding the end of a current loop) with bits from the next word (generally the word encoding the beginning of a next loop) to provide a completely filled word to the serializer. As operation proceeds, the reformatter continues to combine bits from successive words to ensure that completely filled words are produced. Gaps that formerly appeared when producing serial bit streams are thereby eliminated.

BRIEF DESCRIPTION OF THE SEVERAL VIEWS OF THE DRAWINGS

Additional objects, advantages, and novel features of the invention will become apparent from a consideration of the ensuing description and drawings, in which.

DETAILED DESCRIPTION OF THE INVENTION

Figure 1:
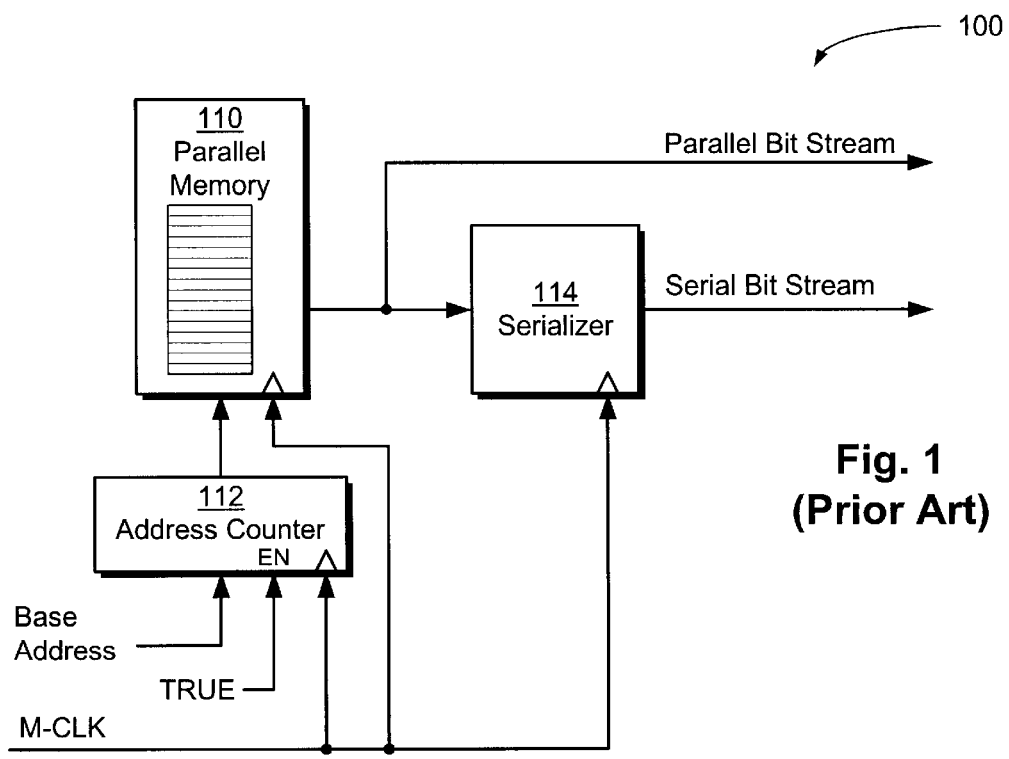
FIG. 1 is a simplified schematic of a conventional circuit used in a tester for generating serial bit streams from a parallel memory.
Figure 2:
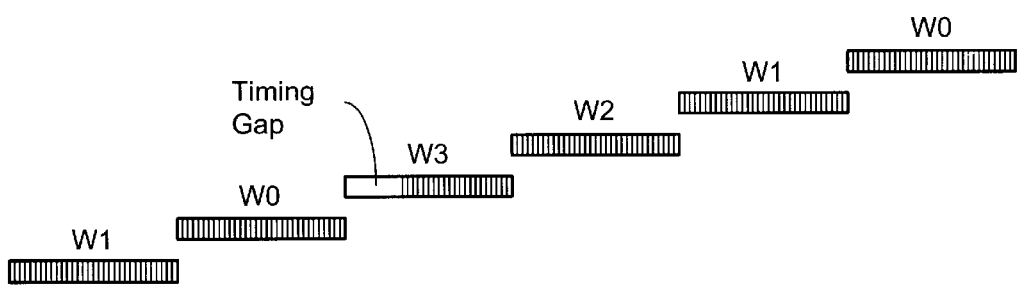
FIG. 2 is an illustration of how a test pattern stored as four parallel words are arranged in serial form and looped in the circuit of FIG. 1, wherein the forth word of the test pattern contains a timing gap.
Figure 3:
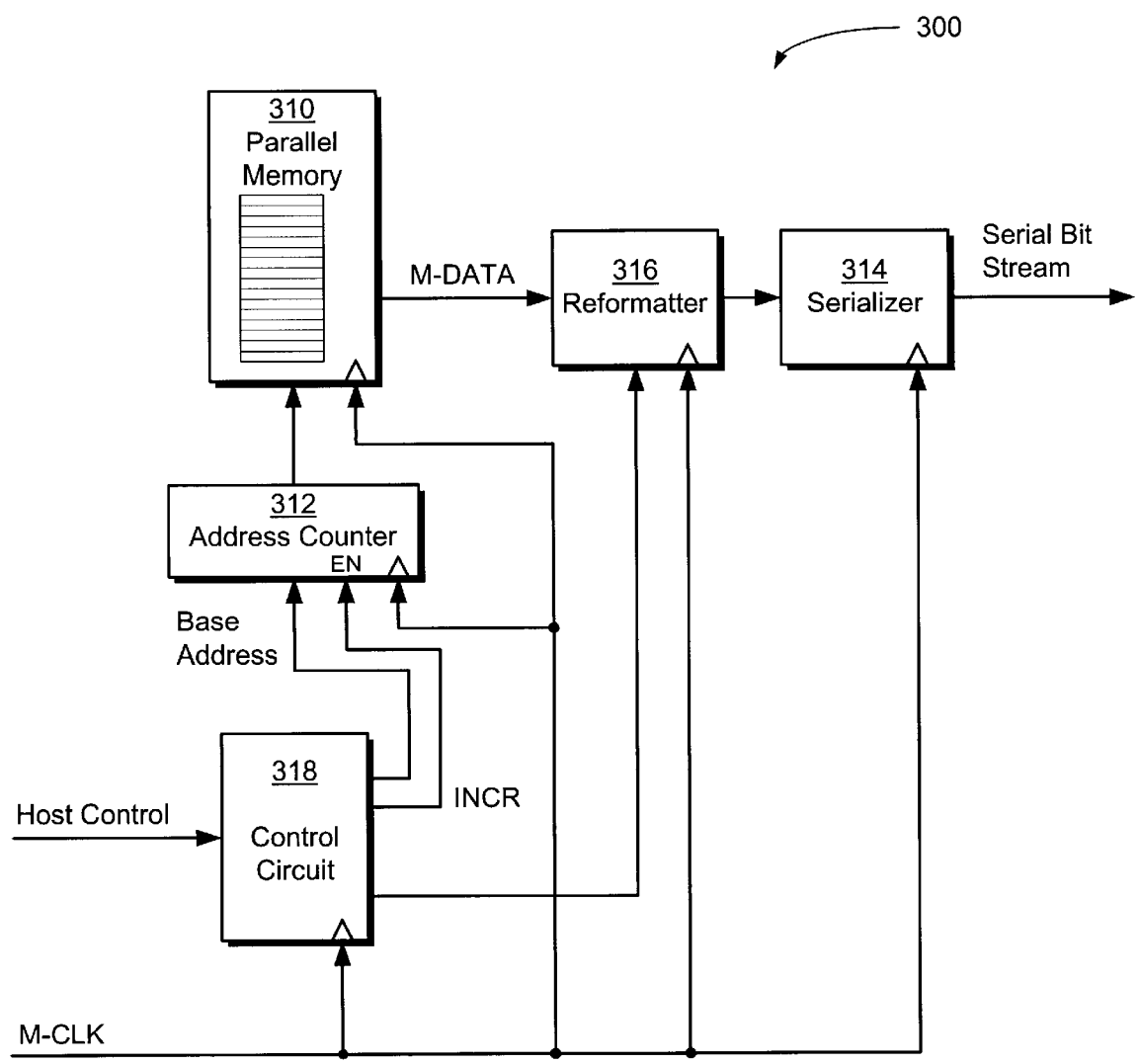
FIG. 3 is a simplified schematic of a circuit embodiment of the invention for generating serial bit streams, which includes a reformatter and a control circuit for removing unwanted timing gaps.

FIG. 3 shows a high level schematic of a circuit 300 according to an embodiment of the invention. The circuit 300 is similar in many respects to the conventional circuit 100 of FIG. 1. For example, the memory 310, address counter 312, and serializer 314 of the circuit 300 correspond to the memory 110, address counter 112, and serializer 314 of the prior art circuit 100. But in addition to these elements, the circuit 300 includes a reformatter 316 and a control circuit 318, which are absent from the prior circuit 100.

The circuit 300 can be used to loop serial bit streams in a similar manner to that described for circuit 100 above. The address counter 312 is set to the base address and is caused to increment through the memory 310. As the address counter is incremented, the serializer 314 outputs serial test signals that correspond to the data stored in the memory. After reaching the last address of the test pattern in the memory, the address counter is reset to the base address the test pattern is repeated.

According to the invention, however, the actions of the reformatter 316 and control circuit 318 are coordinated to eliminate unwanted timing gaps from serial bit streams. As described above, serial bit streams can include timing gaps that arise from incompletely filled data words, for example, from the last word storing the serial bit stream when the serial bit stream is looped. To eliminate these timing gaps, the reformatter 316, under control of the control circuit 318, effectively fills these timing gaps with valid data. The valid data comes from the first word of the memory storing the beginning of the serial bit stream (or, more generally, from the next word that stores serial data that should follow).

Figure 4:
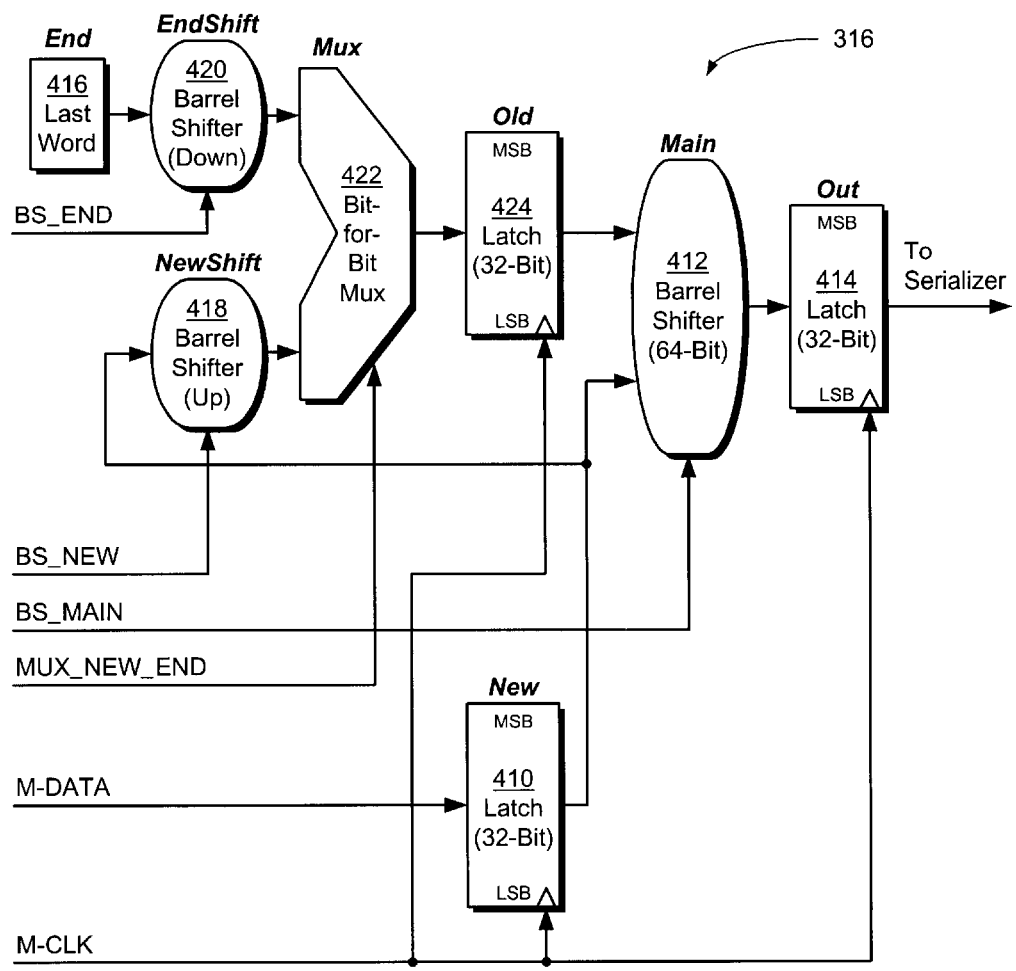
FIG. 4 is a simplified schematic of the reformatter circuit of FIG. 3.

FIG. 4 shows the preferred embodiment of the reformatter 316. The reformatter 316 includes a first latch 410 (New), a second latch 424 (Old), and a third latch 414 (Out). The reformatter also includes a first barrel shifter 412 (Main), a second barrel shifter 420 (EndShift), and a third barrel shifter 418 (NewShift), as well as a bit-for-bit multiplexor 422 (Mux) and a register 416 (End). In the preferred embodiment, the barrel shifters New, Old, and Main can asynchronously and transparently rotate data applied to their data inputs by any number of bits, as specified by their respective control inputs, BS_MAIN, BS_END, and BS_NEW. The bit-for-bit multiplexor (Mux) can preferably select any combination of bits from its two inputs for passage to its output, in response to its control input, MUX_NEW_END. Mux is thus equivalent to M individually controllable 2-to-1 multiplexors, where M is the bit width of words from the memory. The data paths shown in FIG. 4 are all preferably the same bit width, e.g., 32 bits in the preferred embodiment.

Figure 5:
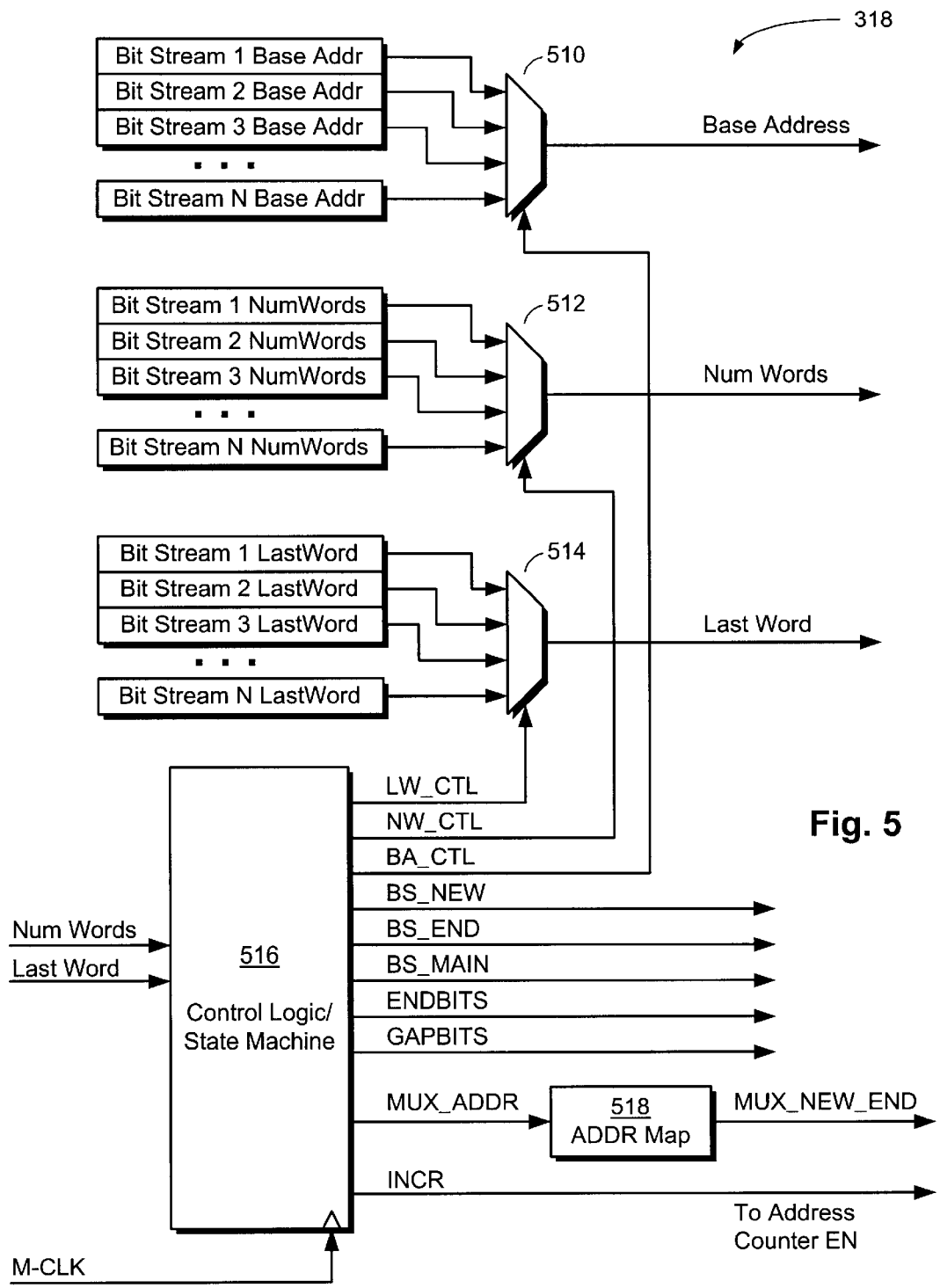
FIG. 5 is a simplified schematic of the control circuit of FIG. 3.

The actions of the reformatter 316 are directed by the control circuit 318, which is shown in FIG. 5. The control circuit 318 includes a Control Logic/State Machine Unit 516, which receives the memory clock M-CLK, as well as control signals and data from a host computer. The Control Logic/State Machine Unit 516 generates signals BS_MAIN, BS_NEW, and BS_END, for configuring Main, New, and End, respectively.

It also generates a signal INCR, for enabling or disabling the address counter 312. In addition, the Control Logic/State Machine generates the signal MUX_ADDR, the precursor of MUX_NEW_END, which controls the setting of the mux 422. An Address Map 518 converts values of MUX_ADDR to values of MUX_NEW_END by assigning MUX_NEW_END to be the number of LSB-justified 1's defined by the value of MUX_ADDR. For example, if MUX_ADDR=5, MUX_NEW_END is "0000 0000 0001 1111." If MUX_ADDR=10, MUX_NEW_END is "0000 0011 1111 1111."

The control circuit preferably includes registers for storing the base addresses, numbers of words, and last word values for a number of different serial bit streams. Data from these registers are selectable via multiplexors 510, 512, and 514, to identify the base address, number of words, and last word of a particular serial bit stream. As will be described in more detail below, the multiplexors can be switched to select different serial bit streams, or to loop on combinations of serial bit streams.

As will become apparent from the ensuing description, the reformatter 316 merges bits from adjacent words to ensure that fully loaded words are outputted to the serializer. Prior to looping, the value of the last word of a serial bit stream is stored in an End register 416. Parallel data (M-DATA) from the memory 310 are fed to the input of New. As a general rule (but subject to many exceptions, described below), data passes in a pipeline fashion from New to Old to Out. To accomplish this, Mux selects only bits from New, NewShift passes data from input to output unaltered, and Main passes all data from Old to Out.

This simple pipeline breaks down, however, when the last word stored in End contains a gap. When it comes time to output the last word under these circumstances, Mux selects all valid bits from End along with some bits from New (which at this point stores the first word in the serial bit stream). As a result, Old contains bits from two different words of M-DATA. Once this point is reached, the reformatter cannot simply continue to output words on their normal word boundaries without skipping or repeating bits. To overcome this problem, the reformatter employs the Main barrel shifter 412. Main receives bits from two successive words of M-DATA (i.e., Old and New). The bits are arranged in proper order so that they essentially form a data word of twice the normal word width (i.e., a 64-bit word). To output words having the proper width, Main selects a window of 32 contiguous bits from among its 64 input bits and passes these bits to its output. The placement of the window used to select these bits depends upon the size of the gap in the last word and the number of times the serial bit stream has been looped. Additional iterations through the loop accumulate offsets, for which the placement of the window must account. By properly placing the window, output words of the proper width and format can be generated, even though they have different word boundaries from that of the input data.

The role of barrel shifters 418 and 420 is to shift the data from New and End, respectively, so that they occupy the proper bit locations.

Figure 6A:
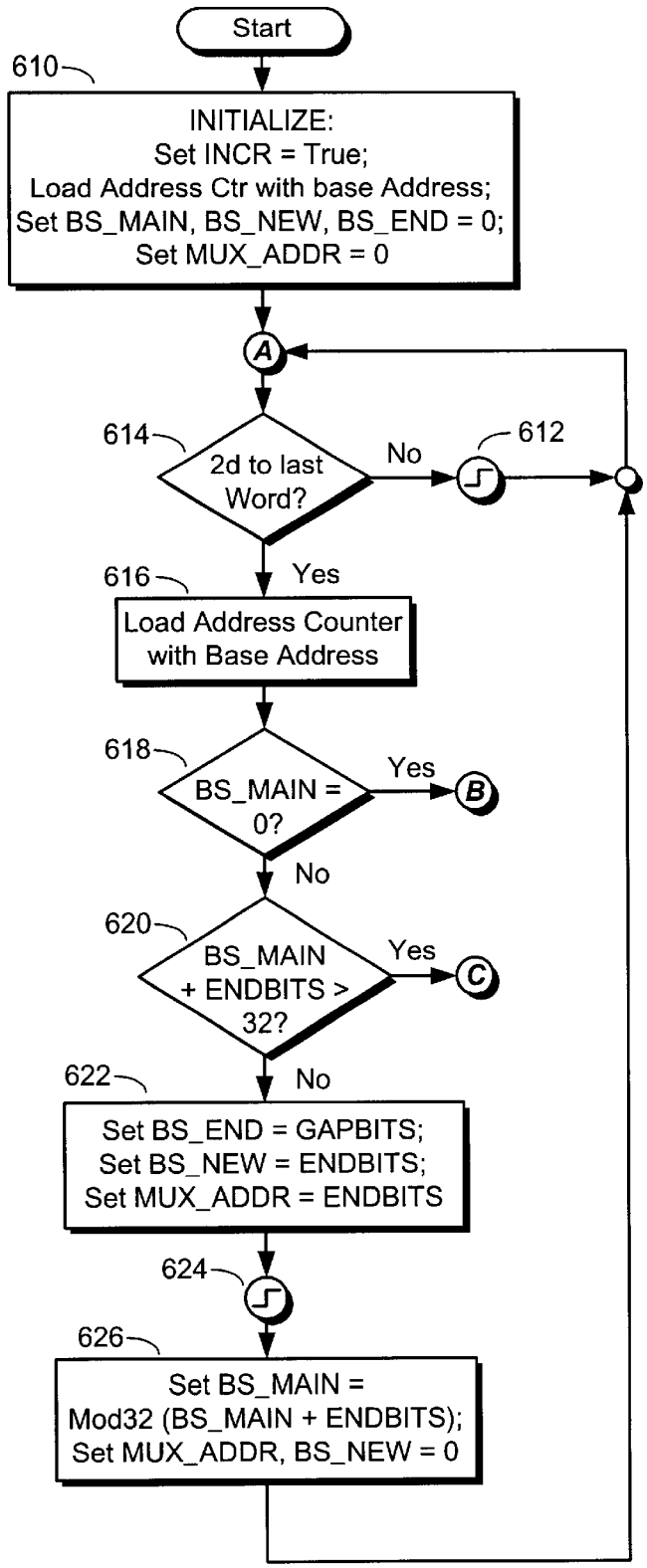
FIGS. 6A and 6B are a flowchart that shows a process embodiment of the invention for converting parallel data to serial form while removing unwanted timing gaps.
Figure 6B:
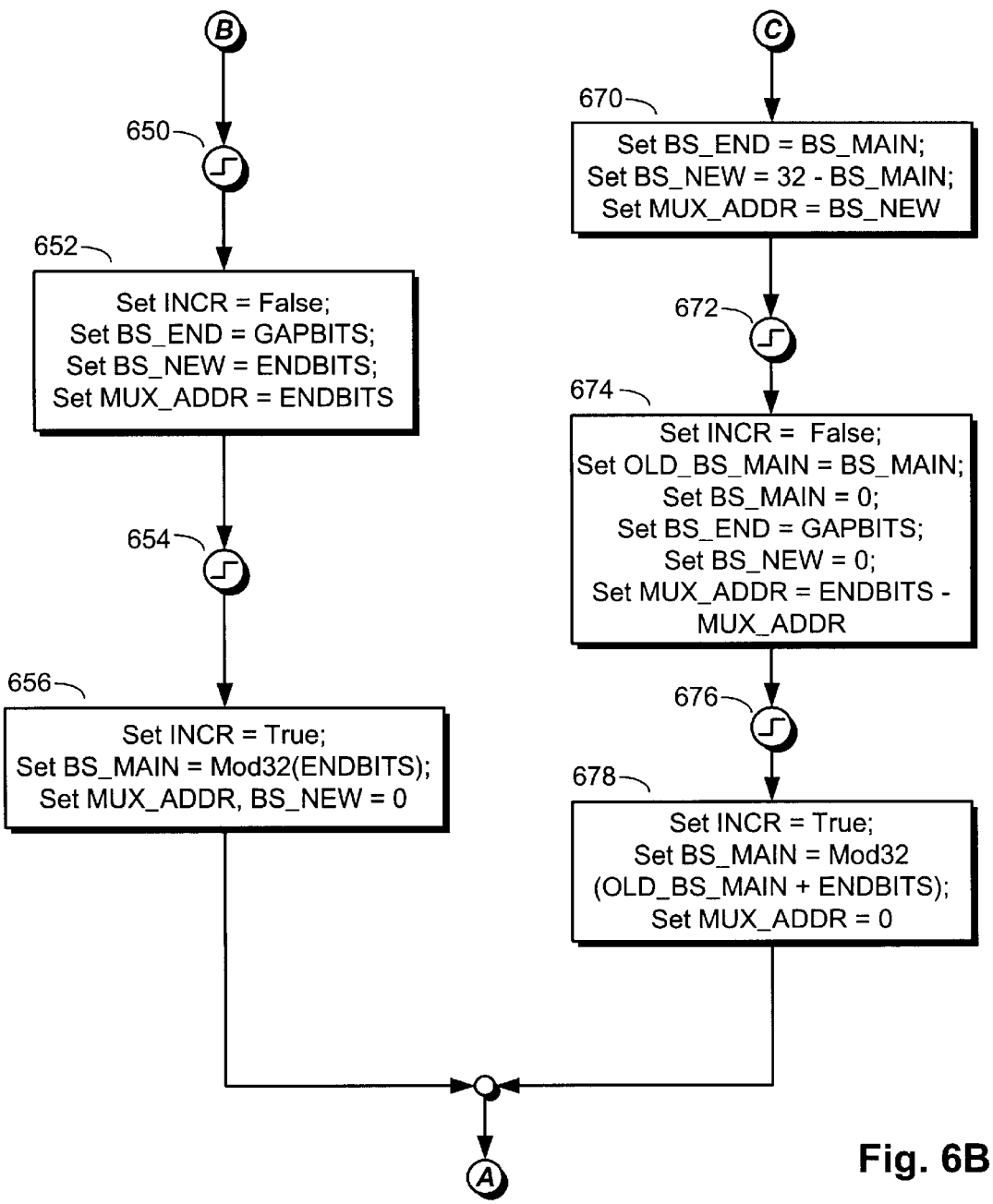

One can more easily understand the detailed operation of the reformatter 316 by referring to the flowchart shown in FIGS. 6A and 6B. A quick inspection of the flowchart reveals that controlling the reformatter consists essentially of controlling the barrel shifters NewShift, OldShift, and Main, the mux 422, and the value and incrementing status of the address counter 312. In the ensuing description, it is helpful to refer to the following definitions:

BS_MAIN=0 or 32 means that Main passes all bits from Old to Out; none of the bits from New are passed through Main;

BS_MAIN in the range from 1 to 31 means that bits (BS_MAIN-1): 0 come from Old and bits 31: BS_MAIN come from New;

BS_NEW shifts up, so that all bits from New are shifted up by BS_NEW bits;

BS_END shifts down, so that all bits from End are shifted down by BS_END bits;

MUX_ADDR is the number of bits (LSB-justified) that Mux passes from End to Old. All other bits are passed from New to Old;

ENDBITS is the number of valid bits in the last word of the serial bit stream;

GAPBITS is set to the size of the gap in the last word (i.e., 32—ENDBITS).

Operation begins with initialization at step 610. The address counter 312 is loaded with the base address of the serial bit steam, and INCR is set to True to enable the address counter to increment in response to M-CLK. In addition, the controls BS_MAIN, BS_NEW, BS_END, and MUX_ADDR are configured to allow "pipelining" operation (see above), wherein the contents of New are passed unchanged to Old and then to Out on successive clock cycles.

Following initialization, control proceeds to Label "A," which represents the point to which control returns upon the completion of each branch of the flowchart. At step 614, control branches based on the current state of New. If New is not the second-to-last word in the serial bit stream (i.e., the word that immediately precedes the prestored last word), the reformatter is clocked (step 612) and control returns to Label A. Clocking the reformatter with the initialized settings causes a new value of M-DATA to be loaded into New on each cycle and causes the current contents of New to be loaded into Old. It also causes the contents of Old (or a combination of bits from Old and New—see below) to be loaded into Out.

Steps 614 and 612 are repeated until New receives the second-to-last word of the serial bit stream. Once this happens, control proceeds to step 616, whereupon the address counter is loaded with the base address to restart the serial bit stream. If BS_MAIN=0 (i.e., if Main is set to receive all its bits from Old), control proceeds to step 650 via Label "B" (see FIG. 6B). The reformatter is clocked, causing the first word of the loop to be loaded into New and the second-to-last word to be loaded into Old. At step 652, the reformatter sets INCR false to prevent the fetching of new data. It also configures the barrel shifters NewShift and EndShift to shift the contents of the last word and the first word to their proper bit locations, and configures the mux 422 to select ENDBITS from the last word and GAPBITS from the first word. These settings allow the reformatter to create a completely filled data word having contents that bridge the end of the serial bit stream and the beginning.

Upon the next instance of the clock (step 654), the value of Old (i.e., the muxed combination of shifted bits from End and New) is loaded into Out. New continues to hold the first word, owing to the fact that INCR=False. Holding this value allows the reformatter to output the residue from the first word on the next clock cycle.

By the time control proceeds to step 656, Out is no longer receiving data on normal word boundaries (i.e., the boundaries of M-DATA). To provide completely filled and properly aligned data to Out, step 656 configures Main to merge bits from Old and New. By setting BS_MAIN to $MOD_{32}$ (ENDBITS), Main selects a proper 32-bit window into the 64-bit data at the input of Main, from which output data is selected—i.e. ENDBITS from Old and GAPBITS from New. Also at step 656, INCR is set back to True and MUX_ADDR and BS_NEW are each reset to 0. These changes allow new data to be fetched and allow the contents of New to pass to Old without alteration. Control then returns to Label A.

Operation continues by repeating the serial bit stream (via steps 614 and 612) until the second-to-last word is again reached. Note that this iteration through the serial bit stream is identical to the first iteration, described above, except that Main is generally set to combine bits from New and Old (i.e., BS_MAIN does not equal 0).

When the second-to-last word has been loaded into New, control proceeds to step 616, whereupon the address counter 312 is again loaded with the base address. Because BS_MAIN does not equal 0, however, control is passed though step 618 to step 620.

At step 620, operation branches depending upon whether BS_MAIN+ENDBITS is less than 32 (or, more generally, the bit width). This condition essentially asks whether appending ENDBITS to the relevant contents of Old (i.e., those that Main passes to Out) causes Old to exceed 32 bits.

If not, execution continues at step 622. As occurred at step 652, the reformatter configures NewShift and EndShift to shift the bits of the last word and first word to their correct positions, and configures the mux 422 to merge bits to create a properly formed word. The reformatter is clocked at step 624. At step 626, BS_MAIN is increased by ENDBITS to form the new number of bits that Main passes from Old to Out (Mod32 of BS_MAIN+ENDBITS is taken to treat the case wherein BS_MAIN+ENDBITS=32 the same as the case wherein this sum equals 0.) In addition, MUX_ADDR and BS_NEW are each reset to 0 to allow the contents of New to pass to Old without alteration. Control then returns to Label A.

Note that it is not necessary during this sequence to set INCR=False. The fact that BS_MAIN+ENDBITS is less than or equal to the word width ensures no new residue is created, which needs to be cleared.

Referring back to step 620, if BS_MAIN+ENDBITS is greater than 32, appending ENDBITS to the relevant contents of Old causes a new word boundary to be crossed, and control proceeds via Label "C" to step 670. Once again, the reformatter configures NewShift and EndShift to shift the bits of the last word and first word to their proper positions, and configures the mux 422 to merge bits from NewShift and EndShift to create a properly formed word. Note that the values of BS_END, BS_NEW, and MUX_ADDR differ from those previously set, to account for the accumulated shift value of Main, which now exceeds the bit width.

The reformatter is again clocked at step 672. Since BS_MAIN+ENDBITS exceeds 32 bits, the reformatter needs to output an additional word (i.e., the residue) to get back into step with the input data. To accomplish this, INCR is set False and the reformatter is configured to output all bits from Old (step 674). Before setting BS_MAIN to 0, however, BS_MAIN is stored in OLD_BS_MAIN, for later retrieval. The contents of Old are sent to Out on the next clock (step 676), and the reformatter's settings are restored at step 678, with a new setting of BS_MAIN, to send the proper bits to Out.

The above-described process continues indefinitely, with the reformatter continuing to loop the serial bit stream without gaps. In the preferred embodiment, a test program running on a tester's computer can specify a number of iterations through the loop to be run, and the reformatter can be configured to stop looping once that number is reached. Looping may also be stopped upon the occurrence of some predetermined event, such as the DUT producing an expected output.

In the preferred embodiment, the reformatter is implemented as an FPGA (Field Programmable Gate Array), although its particular implementation can be varied widely within the scope of the invention. For example, the reformatter could also be implemented with a combination of FPGAs, or as an ASIC (Application Specific Integrated Circuit). It could also be implemented using discrete logic.

Alternatives

Having described one embodiment, numerous alternative embodiments or variations can be made. For example, the above-disclosed implementation assumes that data from the memory is stored in 32-bit words. This can obviously be varied.

The description above has focussed on removing gaps when looping a single serial bit stream. However, it can also be used for looping multiple bit streams, while eliminating gaps between them. For instance, as shown in FIG. 5, the reformatter's control circuit 318 includes multiplexors 510, 512, and 514, for selecting a base address, number of words, and last word from different serial bit streams. By controlling signals LW_CTL, NW_CTL, and BA_CTL, the control circuit 318 can rapidly switch between different serial bit streams to seamlessly append one with another. For example, as Bit Stream 1 is nearing completion, the control circuit can select Base Address, Num Words, and Last Word for Bit Stream 2. When it comes time to reload the base address into the address counter (e.g., step 616), the reformatter can load the base address of Bit Stream 2. Execution then proceeds with control signals set for Bit Stream 2 (i.e., ENDBITS, GAPBITS, and so forth). This can be done for any number of bit streams.

As described herein, the reformatter fills gaps that appear at the end of serial bit streams. This is just an example, however. The circuit and process described herein can easily be modified by those skilled in the art to fill gaps at other locations of serial bit streams.

In the preferred embodiment, the memory stores words that represent the serial bit stream at sequential locations. This need not be the case, provided that the proper sequence of words is known and the address counter can access them sequentially.

As described above, the reformatter stores last word of bit stream in an End register. This is merely a matter of design choice. The reformatter could alternatively store the first word, or, more generally, any word either preceding or following the gap to be filled.

While the invention has been particularly shown and described with reference to the preferred embodiments thereof, it will be understood by those skilled in the art that various changes in form and detail may be made therein without departing from the spirit and scope of the invention.

What is claimed is:

1. A circuit for generating a serial bit stream, comprising:
    a memory having a plurality of words of known bit width for storing at least one serial bit stream having a length that is a non-integer multiple of the bit width, so that at least one of the plurality of words contains a gap;
    a reformatter coupled to the memory for receiving selected ones of the plurality of words and providing a plurality of reformatted words that eliminates each such gap; and
    a serializer coupled to the reformatter for receiving the reformatted words and producing a serial representation thereof.

2. A circuit as recited in claim 1, further comprising:
    an address counter coupled to the memory for accessing the plurality of words; and
    a control circuit, coupled to a host computer, for controlling the address counter and the reformatter.

3. A circuit as recited in claim 1, wherein the reformatter comprises:
    a register for storing one of the plurality of words that contains a gap;
    a latch for storing new words read from the memory; and
    a multiplexor having a first input coupled to the register, a second input coupled to the latch, and an output providing a selectable combination of bits from the register and the latch.

4. A circuit as recited in claim 3, wherein the multiplexor is a bit-for-bit multiplexor that receives the same number of bits at its first and second inputs, and which can assign each bit of its output the value of the corresponding bit at either of its first and second inputs.

5. A circuit as recited in claim 3, wherein the latch is a first latch and the circuit further comprises:
    a second latch coupled to the output of the multiplexor; and
    a barrel shifter having a first input coupled to the first latch, a second input coupled to the second latch, and an output providing a combination of bits from the first latch and the second latch.

6. A circuit as recited in claim 5, wherein the output of the barrel shifter and each of its inputs have the same bit width.

7. A circuit as recited in claim 6, wherein the barrel shifter is constructed and arranged to convey to its output a first range of bits from the first latch and a second range of bits from the second latch.

8. A circuit as recited in claim 5, wherein the barrel shifter is a first barrel shifter, the circuit further comprising:
    a second barrel shifter coupled in series between the register and the first input of the multiplexor; and
    a third barrel shifter coupled in series between the first latch and the second input of the multiplexor.

9. A circuit as recited in claim 8, further comprising a control circuit, wherein the multiplexor and the first through third barrel shifters are asynchronous devices that operate without clocking, in response to respective control signals from the control circuit.

10. A circuit as recited in claim 9, further comprising an address counter, wherein the address counter and the first and second latches are synchronous devices.

11. A circuit as recited in claim 8, wherein
    the second barrel shifter is constructed and arranged for shifting the contents of the register in a downward direction, toward the least significant bit, and
    the third barrel shifter is constructed and arranged for shifting the contents of the first latch in a upward direction, toward the most significant bit.

12. A circuit for generating at least one serial bit stream of arbitrary length stored in a memory having a plurality of parallel words, comprising:
    a reformatter for receiving the plurality of words and providing a plurality of reformatted words; and
    a serializer coupled to the reformatter for receiving the reformatted words and producing a serial representation thereof, wherein the at least one serial bit stream fits unevenly into the parallel words so as to leave a gap in at least one word, and wherein the reformatter includes a combining circuit for merging bits from successive ones of the plurality of words to eliminate each such gap therefrom.

13. A circuit for looping at least one serial bit stream of arbitrary length stored in a memory having a plurality of parallel words, comprising:

means for reformatting the plurality of parallel words; and means for serializing the reformatted plurality of parallel words to produce a serial representation thereof, wherein the at least one serial bit stream fits unevenly into the parallel words so as to leave a gap in at least one word, and wherein the means for reformatting includes means for merging bits from successive ones of the plurality of words to eliminate each such gap therefrom.

14. A method for generating at least one serial bit stream stored in a memory in the form of a plurality of parallel words, the at least one serial bit stream having a length that is a non-integer multiple of the bit width, so that at least one of the plurality of words contains a gap, comprising:

reformatting the plurality of parallel words to produce a plurality of reformatted parallel words that eliminates each such gap; and converting the reformatted words to a serial bit stream.

15. A method as recited in claim 14, wherein the step of reformatting comprises merging bits from successive ones of the plurality of parallel words to fill each such gap with data from a successive word.

16. A method as recited in claim 15, further comprising looping the at least one serial bit stream, wherein the reformatting step removes any gap at boundaries between successive iterations of the loop.

17. A method as recited in claim 14, wherein the memory stores a plurality of serial bit streams, the method further comprising:

outputting a first of the plurality of serial bit streams;

outputting a second of the plurality of serial bit streams to form a combined data stream including the first and second serial bit streams; wherein the step of reformatting removes any gap at a boundary between the first and second serial bit streams.

18. A method as recited in claim 17, further comprising:

looping the combined data stream, wherein the reformatting step removes any gap at boundaries between successive iterations of the combined data stream.

19. A method as recited in claim 14, further comprising:

applying the serial bit stream to an input of a device under test; and measuring a characteristic of the device under test.

20. A method as recited in claim 19, further comprising:

producing a passing test result responsive to the characteristic being within allowable limits; and producing a failing test result responsive to the characteristic being outside the allowable limits.

* * * * *